(12) United States Patent
Monti et al.

(10) Patent No.: US 7,979,223 B2
(45) Date of Patent: Jul. 12, 2011

(54) SYSTEMS AND METHODS FOR POWER HARDWARE IN THE LOOP TESTING

(75) Inventors: Antonello Monti, Irmo, SC (US); Salvatore D'Arco, Naples (IT)

(73) Assignee: University of South Carolina, Columbia, SC (US)

( * ) Notice: Subject to any disclaimer, the term of this patent is extended or adjusted under 35 U.S.C. 154(b) by 411 days.

(21) Appl. No.: 12/139,639

(22) Filed: Jun. 16, 2008

(65) Prior Publication Data
US 2008/0312855 A1 Dec. 18, 2008

Related U.S. Application Data

(60) Provisional application No. 60/934,777, filed on Jun. 15, 2007.

(51) Int. Cl.
*G01R 19/00* (2006.01)
(52) U.S. Cl. ............... 702/64; 702/57; 702/60; 702/65; 363/13; 363/16; 363/40
(58) Field of Classification Search .............. 702/57, 702/60, 64, 65; 363/13, 16, 40
See application file for complete search history.

(56) References Cited

OTHER PUBLICATIONS

Monti et al. "A New Architecture for Low Cost Power Hardware in the Loop Testing of Power Electronics Equipments", IEEE International Symposium on Industrial Electronics, Jun. 30-Jul. 2, 2008.

Monti et al. "A Virtual Testing Facility for Elevator and Escalator Systems", Power Electronics Specialists Conference, Jun. 17-21, 2007, pp. 820-825.

Monti et al. "From Simulation to Hardware Testing: a Low Cost Platform for Power Hardware in the Loop Experiments", Society for Computer Simulation International: Proceedings of the 2007 Summer Computer Simulation Conference, Jul. 2007.

*Primary Examiner* — Sujoy K Kundu
(74) *Attorney, Agent, or Firm* — Dority & Manning, P.A.

(57) ABSTRACT

A system for power hardware in the loop testing is described. The system includes a power system and a control system, the power system connected to a power converter of a device under test, the control system being in communication with the power system and the power converter. The control system determines the voltage input to the power system by utilizing the voltage output of the power converter, the voltage input determination being made by a control algorithm comprising.

$$v_{Ok} = Sx_k + Pv_{Ik} + Qi_{Ak+1}$$

where:

$$S = \frac{1}{T}\left(CL_A \frac{\frac{T}{C} + \frac{L_B}{T} + R_B + R_C}{T + CR_C} - L_B - C\frac{L_B + R_B T}{T + CR_C}\right)$$

$$P = 1 + \frac{C}{T + CR_C}\frac{L_B + R_B T}{T}$$

$$Q = -\frac{L_A + R_A T}{T} - \frac{L_B + R_B T}{T} - \frac{C}{T + CR_C}\frac{L_A + R_A T}{T}\frac{L_B + R_B T}{T}$$

20 Claims, 12 Drawing Sheets

SYSTEMS AND METHODS FOR POWER HARDWARE IN THE LOOP TESTING

CROSS REFERENCE TO RELATED APPLICATION

The present application is based on and claims priority to U.S. Provisional Application Ser. No. 60/934,777 having a filing date of Jun. 15, 2007.

BACKGROUND

Hardware-In-the-Loop (HIL) is increasingly recognized as an effective approach for simplifying the process of prototyping and testing of complex systems. In the HIL approach, real hardware components being tested interact with an operational virtual environment that combines a real-time simulation engine with an electronic interface for analog and digital signals. Subsystems signally coupled with the hardware are replaced and emulated by virtual models reproducing both the dynamic behavior and the signal interactions of their real counterparts. The dynamic behavior is predicted executing a real-time simulation of mathematical models of the subsystems; each digital and analog signal necessary for the normal operations is replicated by means of an electronic interface. In a realistic HIL experiment, the hardware under test cannot distinguish the real environment from its emulated equivalent. As an example, parts of a vehicle (e.g. electronic boards, sensors) can be tested under different operating conditions with a simulated model of the vehicle where they will be installed. At present, HIL techniques are commonly adopted in many fields of research and industry (e.g. automotive, avionics, electronics) and it has been demonstrated that they can drastically reduce time and costs in the design and testing process. Different platforms for HIL simulation have already been developed and are currently commercially available, such as Opal-RT, dSPACE, RTDS. However, HIL techniques are mainly confined to testing the low-power section (i.e. electronic boards, sensors, low-power actuators) of complex systems since only a signal coupling between the real hardware and the HIL platform is provided.

A natural extension of the concepts of HIL leads to Power-Hardware-In-the-Loop (PHIL) simulations in which natural couplings (nodes involving conservation of energy) are established and a much more significant amount of energy can be virtually exchanged between the simulated environment and the hardware being tested. Practically speaking, a PHIL platform is an extension of a HIL platform where a high performance power amplifier is used as interface between the real and the simulated world. The main challenge is to realize this addition with null or at least minimum impact on the overall platform performance. This means that the control system of the power amplifier must present a bandwidth significantly higher than the range of frequencies under analysis within the experiment. A PHIL platform that can be utilized to emulate the behavior of an electrical machine in order to perform verification tests on power electronic converters is needed.

SUMMARY

The present disclosure is directed to systems and methods for power hardware in the loop testing. For instance, in one embodiment, a system for power hardware in the loop testing is described. The system includes a power system and a control system, the power system connected to a power converter of a device under test, the control system being in communication with the power system and the power converter. The control system determines the voltage input to the power system by utilizing the voltage output of the power converter, the voltage input determination being made by a control algorithm comprising $$v_{Ok} = Sx_k + Pv_{Ik} + Qi_{Ak+1}$$

where:

$$S = \frac{1}{T}\left(CL_A \frac{\frac{T}{C} + \frac{L_B}{T} + R_B + R_C}{T + CR_C} - L_B - C\frac{L_B + R_B T}{T + CR_C}\right)$$

$$P = 1 + \frac{C}{T + CR_C}\frac{L_B + R_B T}{T}$$

$$Q = -\frac{L_A + R_A T}{T} - \frac{L_B + R_B T}{T} - \frac{C}{T + CR_C}\frac{L_A + R_A T}{T}\frac{L_B + R_B T}{T}$$

Other features and aspects of the present disclosure are discussed in greater detail below.

DESCRIPTION OF FIGURES

A full and enabling disclosure, including the best mode thereof, directed to one of ordinary skill in the art, is set forth more particularly in the remainder of the specification, which makes reference to the appended figure in which.

DETAILED DESCRIPTION

Figure 1:
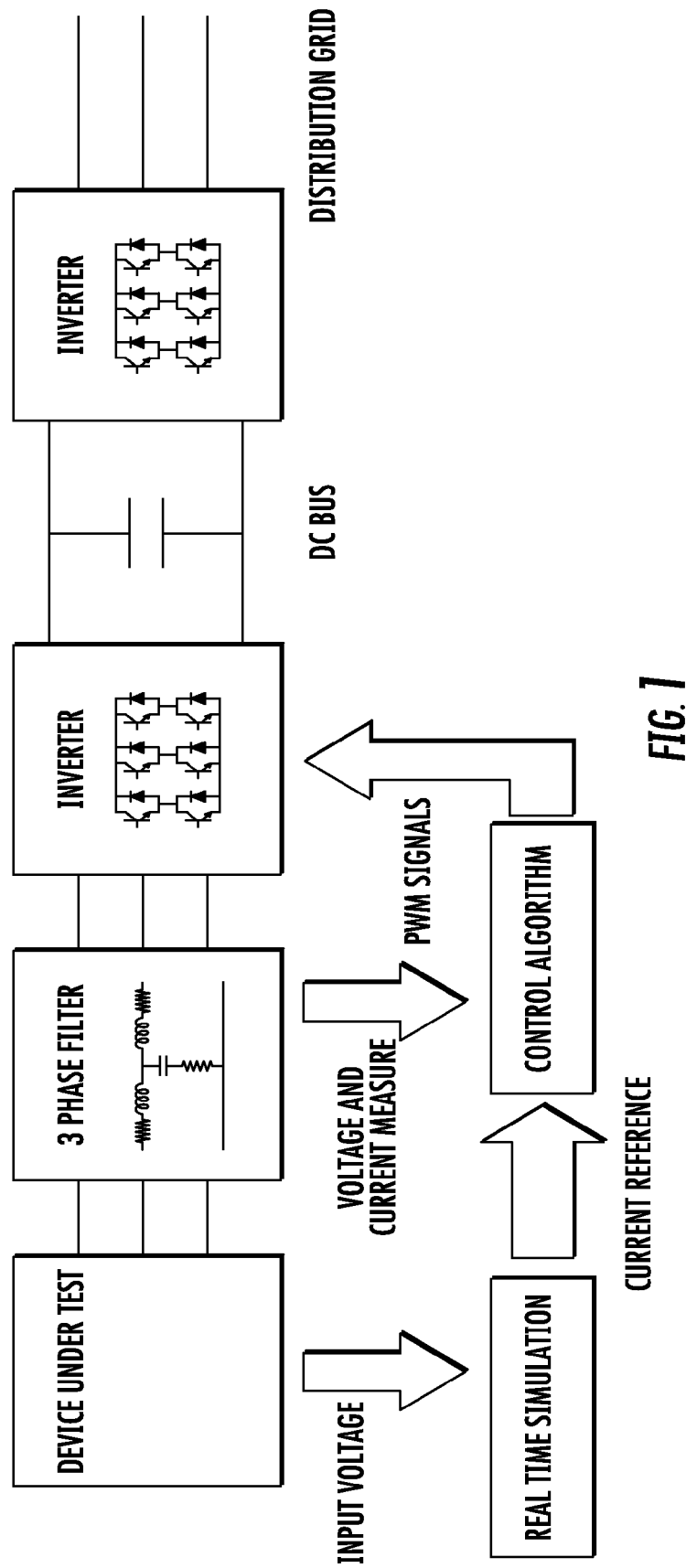
FIG. 1 illustrates the configuration and schematic overview of the whole PHIL platform system.

Reference now will be made in detail to various embodiments of the disclosure, one or more examples of which are set forth below. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment, can be used on another embodiment to yield a still further embodiment. Thus, it is intended that the present disclosure covers such modifications and variations as come within the scope of the appended claims and their equivalents.

The present disclosure describes a PHIL platform specifically designed to emulate the behavior of an electrical machine (or a generic electrical load) in order to perform verification tests on power electronic converters. The platform is intended to replace electrical machines connected to mechanical loads and having various nominal ratings and electromechanical characteristics. The possibility of completely reconfiguring the characteristics of the machine and load at a software level alone is expected to simplify the testing procedure and reduce the associated costs. While electrical machine as a load is one embodiment of this invention, the approach can be applied to a wider variety of electrical loads by simply changing the software model.

In order to design a virtual system that behaves realistically, ensuring high bandwidth in the simulation/hardware interface is important. One interface that has been adopted in the present disclosure is composed of a standard three-phase inverter connected through a third order RLC filter.

The selected interface can be controlled with many different algorithms. The main characteristics that any algorithm should have can include accuracy, fast response (high bandwidth), stability for every platform configuration, and low sensitivity to parameter variations.

The systems and methods described herein can replace electrical machines connected to mechanical loads and having various nominal ratings and electromechanical characteristics. The present disclosure can have a dramatic impact on the total costs of quality assurance testing for various reasons, including:

1) A single platform can be used for a variety of products by simply substituting the real-time model of the equipment under test. This can allow for better use of testing labs instead of having a finite set of test-beds, each one dedicated to a specific product.

2) A PHIL solution can allow more flexibility for new products. Moving from example to product can require only software changes and no hardware acquisition.

3) The testing procedure can be detailed with reference to the simulation model used for the control design and the control performance can be easily tested versus the requirements defined during the design itself.

4) The robustness of the control algorithms can be easily tested and quantified de-tuning the real-time model of the system with respect to the design parameters.

5) The system can regenerate energy back in the mains limiting the number of conversion stages and avoiding conversion in mechanical energy.

6) The absence of moving parts can also make easier the management of the testing laboratory from a safety standpoint.

7) The absence of moving parts can reduce the maintenance costs of the facility.

Because the converters that can be tested with this system involve a wide range of power ratings (1 kW-100 kW), the present disclosure can represent a significant advance in applying the PHIL technology to real-world problems.

As stated previously, in order to design a virtual system that behaves realistically, ensuring high bandwidth in the simulation/hardware interface is important. This kind of bandwidth in general can not be achieved by using standard PI control for the current loops. The interface can be composed of a standard three-phase inverter with every phase connected through a third order RLC filter. An algorithm based on the model inversion has been developed to control the inverter and achieve satisfactory bandwidth performances and stability. In particular, the present disclosure describes in detail the theoretical and practical aspects connected to the design and implementation of the algorithm described herein.

Current electromechanical methods for testing the power load outputted by electronic converters connected to machine hardware can be costly and time consuming depending on what hardware is being tested. The present invention eliminates the need to test a system with the actual hardware (real load) present. The invention is a PHIL platform designed to perform diagnostic tests on three-phase power converters by replacing the electromechanical load connected to their terminals. FIG. 1 illustrates the working system as a whole. The system is composed of a passive RLC filter, an inverter controlled by the data from the real-time simulation, a DC bus, and an active front-end with the means to allow for energy recovery. The real-time simulation can be performed by any commercially available software (i.e. VTB-RT, MatLab, and others). The terminals of the converter being tested are directly connected to the filter. The behavior of the real load is emulated by applying the proper voltages on the opposite side of the filter in such a way that the currents flowing in the filter are the same as those of the real load. The voltage output of the converter is continuously measured using the Gate-Signal Averaging Method, and a real-time simulation is then executed in order to determine the currents that would flow in the real load. These currents constitute the references for a control algorithm that, depending on the filter, determine the voltage to be applied on the controlled side of the filter. Depending on the calculated voltages and the DC-bus voltage, PWM signals are generated to drive the gates of the inverter legs. The control algorithm is an important part of the scheme because it should ensure accurate tracking performance (bandwidth and low ripple content) and stable operations.

Figure 2:
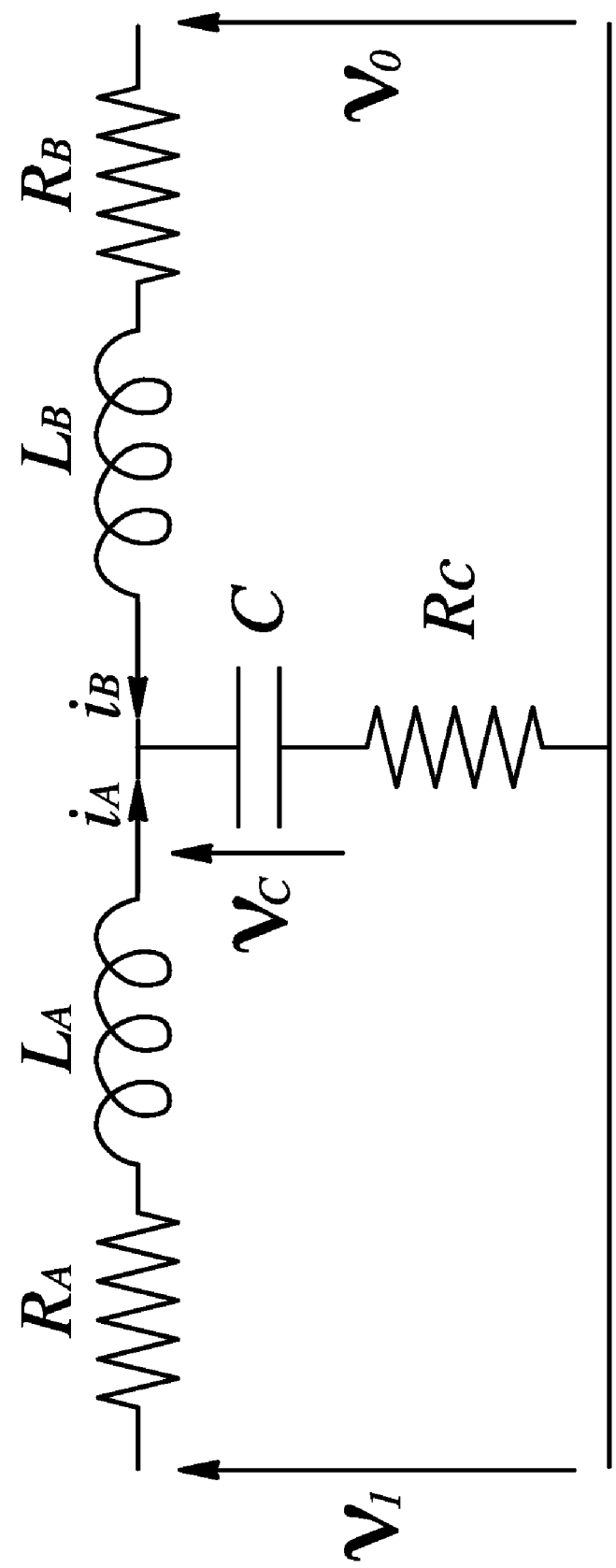
FIG. 2 illustrates the topology of the RLC filter.

The control algorithm topology (RLC filter) is shown in FIG. 2. The filter can be a single phase filter or can be extended to a three-phase structure. The filter in FIG. 2 represents a third-order system whose dynamic equations in the state-space form are $$\dot{x} = Ax + Bu \qquad (eq.\ 1)$$

where:

$$x = \begin{pmatrix} i_A \\ i_B \\ v_C \end{pmatrix}$$

$$u = \begin{pmatrix} v_I \\ v_O \end{pmatrix}$$

$$A = \begin{pmatrix} -\dfrac{R_A + R_C}{L_A} & -\dfrac{R_C}{L_A} & -\dfrac{1}{L_A} \\ -\dfrac{R_C}{L_B} & -\dfrac{R_B + R_C}{L_B} & -\dfrac{1}{L_B} \\ \dfrac{1}{C} & \dfrac{1}{C} & 0 \end{pmatrix}$$

$$B = \begin{pmatrix} \dfrac{1}{L_A} & 0 \\ 0 & \dfrac{1}{L_B} \\ 0 & 0 \end{pmatrix}$$

The aim of the control algorithm is to determine the voltage $v_o$ that should be applied to the filter in order to obtain a current $i_a$ that tracks the current reference $i_a^*$. The voltage input $v_i$ and the filter states ($i_a\ i_b\ v_c$) are assumed to be directly measurable. Since the control algorithm is implemented on a digital platform, a discretized version of the dynamic model is adopted. In particular, different algorithms can be obtained based on the type of discretization performed for the model. During the theoretical analysis, three different algorithms have been derived: trapezoidal approximation (bilinear), exact calculation of the exponential matrix, and backward difference. During numerical simulations, the differences among them in terms of dynamic performance (bandwidth, tracking reference) are negligible. However, in two of them, instability arises for certain combinations of filter parameters; therefore, the only stable algorithm will be analyzed in more detail here. The stable algorithm is based on the approximation of derivatives with backward differences. The discretized model of the system can be denoted by:

$$\frac{x_k - x_{k-1}}{T} = Ax_k + Bu_k \quad \text{(eq. 2)}$$

where T is the sampling time for the discretization. Rearranging equation 2, the following algebraic system can be derived (eq. 3):

$$\begin{pmatrix} i_{Ak} \\ i_{Bk} \\ v_{Ck} \end{pmatrix} = (I - A)T \begin{pmatrix} i_{Ak+1} \\ i_{Bk+1} \\ v_{Ck+1} \end{pmatrix} - BT \begin{pmatrix} v_{Ik} \\ v_{Ok} \end{pmatrix}. \quad \text{(eq. 3)}$$

The algorithm is based on the algebraic inversion of the system. In order to derive the control algorithm, $i_{Bk+1} v_{Ck+1} v_{Ok}$ (eq. 3) can be assumed as unknown while $i_{Ak+1}$ can be assumed to be equal to the reference value. Solving the system leads to:

$$v_{Ok} = Sx_k + Pv_{Ik} + Qi_{Ak+1} \quad \text{(eq. 4)}$$

where:

$$S = \frac{1}{T}\left(CL_A \frac{\frac{T}{C} + \frac{L_B}{T} + R_B + R_C}{T + CR_C} - L_B - C\frac{L_B + R_B T}{T + CR_C}\right)$$

$$P = 1 + \frac{C}{T + CR_C} \frac{L_B + R_B T}{T}$$

$$Q = -\frac{L_A + R_A T}{T} - \frac{L_B + R_B T}{T} - \frac{C}{T + CR_C} \frac{L_A + R_A T}{T} \frac{L_B + R_B T}{T}$$

The algorithm aims to track the reference current during each execution step using the state of the filter as feedback and is not computationally complex since only simple algebraic operations are involved.

As previously mentioned, a critical aspect in the development of the control algorithm is stability. Assuming zero-hold inputs for the filter, a discretized version of the system can be easily obtained.

$$\chi_{k+1} = \Phi \chi_k + \Gamma u_k \quad \text{(eq. 5)}$$

where:

$$\Phi = e^{AT} \Gamma = A^{-1} * \Phi - I)$$

The algorithm acts as a control in the state space and then affects the location of the poles and zeros of the filter. The stability of the algorithm can be verified by calculating the eigenvalues of the combined system of equations 4 and 5.

$$\chi_{k+1} = \Phi \chi_k + \Gamma_1 v_{1k} + \Gamma_o v_{ok} \chi_{k+1} = \Phi \chi_k \Gamma_z v_{1k} + \Gamma_o (S \chi_k + P v_{1k} + Q i_{Ak+1})$$

$$\chi_{k+1} = (\Phi + \Gamma_o S) \chi_k + (\sigma_1 + \Gamma_o P) v_{1k} + \Gamma_o Q i_{Ak+1} \quad \text{(eq. 6)}$$

where $\Gamma = (\Gamma_t, \Gamma_o)$

In order to ensure the stability of the whole system, the eigenvalues of the matrix $(\Phi + \Gamma_o S)$ can be evaluated and checked to verify that they have a module lower than 1. Considering that an analytical expression for the eigenvalues cannot be obtained due to the algebraic complexity of the system, the chosen algorithm has been tested for a wide range of values of the filter parameters. In every case, the algorithm was stable.

The structure of a PHIL platform specifically designed to replace a standard bench for quality tests on power converters is now described further. The testing platform should appear to the converter under test as much as possible as the electromechanical load connected during the standard testing procedure. The platform has to reproduce each physical and logical interaction between the converter under test and the electromechanical load. The primary physical interaction to replicate is the exchange of energy by means of the currents flowing out from the electrical output terminals of the converter. The testing platform has to include a power section that can be capable to drain the same currents as the emulated load. The configuration of the power section here described is composed by an inverter with an active front-end that is connected to the converter under test through a three-phase filter. In this configuration, the currents drained in each branch of the filter can be regulated by controlling the output voltages of the inverter.

Furthermore, the testing platform should reproduce each signal communication, both analog and digital, that could be present between the load and the inverter under test. As an example, in converters with closed loop control algorithms, it can be necessary to generate feedback signals for the position and/or for the rotating velocity of the electrical machine (i.e. encoder signals).

These objectives can be accomplished by a PHIL approach based on the repetition of the following sequence of steps:
  The output voltages of the converter under test are measured or estimated. In the specific implementation, the voltage has been reconstructed from the pulse width modulation (PWM) signals controlling the converter under test and its DC bus voltage.
  A numerical model of the electromechanical load is simulated in a real-time simulation environment adopting the output voltages of the converter as input. The simulation can evaluate the status of the electrical and mechanical quantities expected in the real load.
  The currents flowing in the load resulting from the simulation are adopted as references to a control algorithm for the inverter in the power section. Based on the these references, on the status of the filter and on the output voltages of the converter under test, this algorithm has to evaluate the output voltages for the inverter that have to be applied to the filter in order to drain currents close to the references.
  The output voltages calculated by the algorithm can be converted in PWM signals for driving the semiconductor components of the inverter.
  The analog and digital signals required by the converter under test should be generated. For example, the rotational velocity of the load resulting from the simulation is adopted to generate coherent encoder signals.

Figure 7:
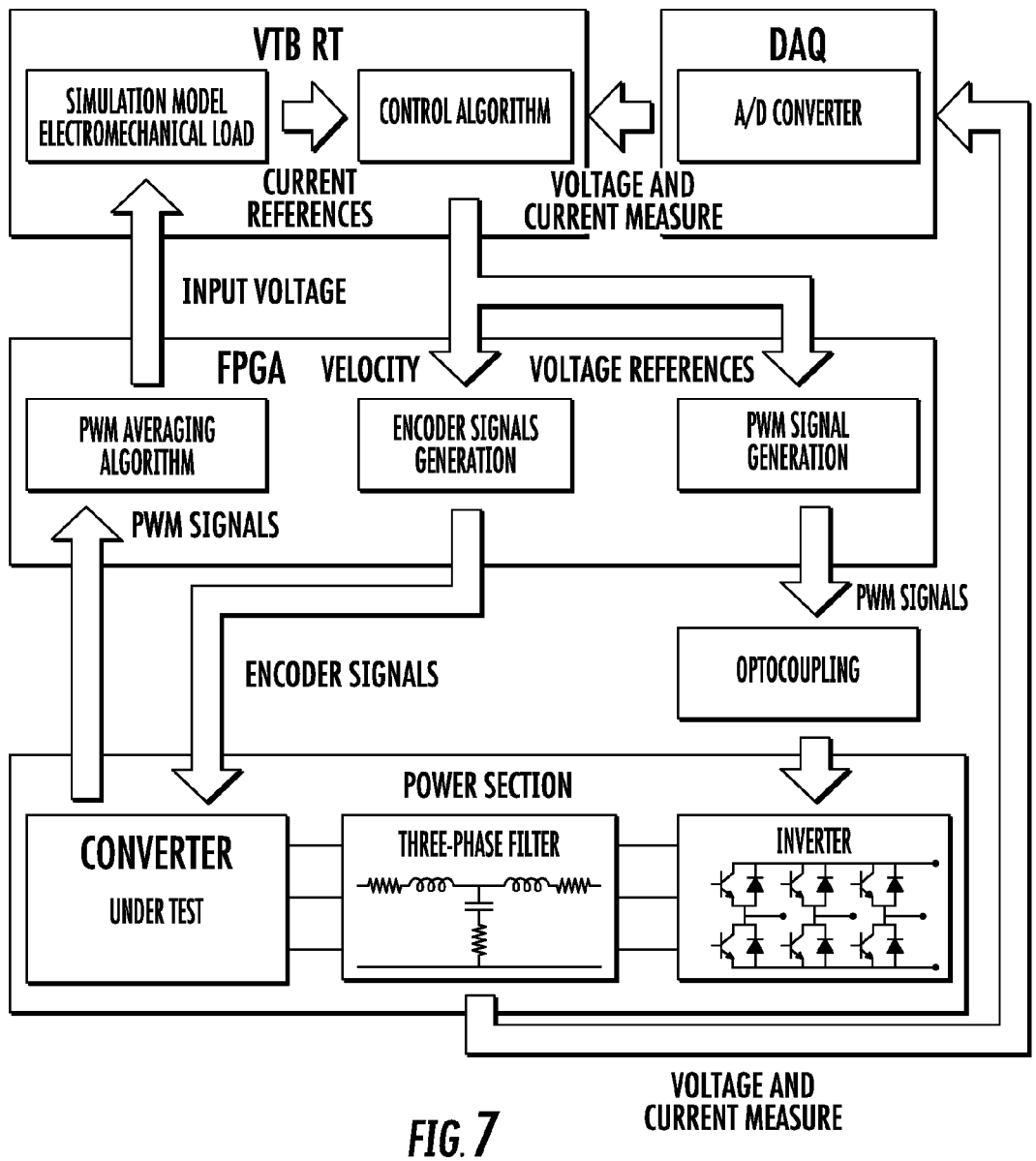
FIG. 7 illustrates a schematic of the test bed.

A schematic of the functional structure of the testing platform is shown in the following FIG. 7.

The computational efforts are shared between a main unit based on a Linux operative system running a real time simulation environment and a field programmable gate array (FPGA). Real time simulations are executed in virtual test bed real time (VTB-RT). In VTB-RT are implemented both a numerical model of the electromechanical load that has to be emulated and the control algorithm for the inverter. The calculation involved in the simulation and control implies on a general purpose PC (standard Pentium machine) an execution time around 100 μs which is too large to handle PWM or encoder signal communications. These operations are then managed by a FPGA. A FPGA can run simple algorithms in a very short time step (order of 10 nanosecond) and can act as a programmed interface for the digital communications between the main unit and both the converter under test and the hardware parts in the power section. The signals are connected to the power section through an insulation board that ensures galvanic insulation from the power section with opto-couplers. As more detailed herein, FPGA executes three algorithms for operations on digital signals:

Generation of the PWM control signals for the inverter. The FPGA receives three normalized voltage references for the inverter from the control algorithm in the main unit and produces three PWM signals and their negated for controlling the six switching devices of the inverter. In the algorithm the switching frequency of the inverter is assumed as a configurable parameter.

Generation of the encoder signals for the converter under test. The FPGA receives the velocity calculated during the simulation and produces the three signals corresponding to the output of an incremental encoder.

Estimation of the voltage in output from the converter under test. The FPGA receives the PWM signals from the converter under test. The signals are averaged for a time interval equal to the execution time of the main control unit by applying the gate-signal averaging method. The algorithm evaluates the duty cycle corresponding to a simulation time step for each phase and transfers these values to the main unit. Based on the duty cycle for each phase and the DC bus voltage the main unit can reconstruct the output voltages for the converter under test.

The control algorithm needs data about the analog variables associated to the status of the filter. The filter is then equipped with three voltage transducers for the measurement of the voltages on the capacitors and four current transducers for the measurements of the current in the inductors of two phases. A data acquisition (DAQ) board provides to the digital conversion of the transduced measurements. The software interface between the DAQ board and the VTB-RT environment is based on drivers developed by Comedi.

Various embodiments of the present disclosure are possible and contemplated. In this regard, certain aspects of what is described herein can be modified so to improve the performance of the invention.

For instance, an important step in the execution of the control algorithm is the measurement of the voltage generated by the converter under test. These voltages represent the input for the real time simulation and, thus, a correct estimation of them is necessary to achieve an accurate reproduction of the real hardware. As described herein, the voltages were not directly measured but reconstructed from the PWM signals of the inverter. In particular the duty cycle for each component was obtained directly accessing the gate signals of the converter under test and then processing them by means of an FPGA. This solution allows for simplification of the hardware avoiding the use of voltage transducers. However, such a structure may not be profitable in the perspective of a standardization of the platform: it is in effect extremely dependant on the control electronics of the converter under test. In fact, the platform interface can be specifically customized on the characteristics of the signals that drive the gates.

In addition, these signals may not be easily available on an industrial type converter. This is not acceptable for a rapid reconfiguration of the platform in the case that inverters from different brands are tested sequentially.

For this reason, a new circuit for voltage estimation could be adopted. The easiest solution is to measure the voltage directly averaging the inverter output rather than the signals driving the gates. The voltages on the terminals of the converter under test are scaled and reduced to a signal level by means of a transduction circuit that provides also galvanic insulation (e.g. hall effect sensors). The output is then quantized at two levels to remove disturbance and ringing: this step can be simply performed by means of a comparator. The signals are finally digitalized and processed by the same algorithm in the FPGA described herein in order to evaluate the average voltage on each phase. The approach is still based on the Gate Signal Averaging (GSA) described herein. It should be noted that the GSA performs an averaging over the simulation period and not over the switching period. Considering that with current real-time simulation platforms it is quite easy to have more simulation steps for each switching period of the power converter, the adopted algorithm allows the reconstruction not only of the average value of the voltage but also of some of the more significant harmonic components.

The main improvement is that the gate signal is reconstructed from a rescaled version of the power signal instead of using the direct information of the gate signal. This embodiment allows the platform to be connected to the device under test without any intrusive cable connection.

Experimental test on the platform demonstrated that the filter structure also described herein is effective to decouple the operations of the converter under test from the controlled converter. However in certain embodiments, the filter can be revised.

For instance, the capacitor and its related voltage transducer can be revised. The experimental tests (as noted in the example section) demonstrated that the voltages across the capacitors are the noisiest signals and that this noise can negatively impact the control algorithm propagating itself on the computed current references. The problem can be addressed by replacing the capacitors with high-ripple low-ESR capacitors and by adding a low pass filter on the transducer outputs. In particular, given the specifications for the capacitors (rated voltage of hundreds of Volts, capacitance of hundreds of μFarads), film capacitors for power electronics applications are the best option available on the market. This measurement is important for the closed loop operation of the current control.

The filter cut-off frequency should be selected high enough to not interfere with the control algorithm and/or altering its bandwidth (in the simulations a frequency distance of a decade seemed a reasonable compromise).

In other embodiments, the choice of the value for the series resistances in the filter can be modified. Both the simulations and the experimental results proved that higher resistance values correspond to smoother and more stable operations of the platform. This is a consequence of a stronger dampening effect on oscillations when the value increases. In addition, the resistances can be responsible for limiting the currents in case of inaccuracies in the generation of the voltage on the controlled side of the filter. However, higher values of the resistances lead also to higher losses in the filter and to the necessity of operating with higher voltages for a given rated current of the platform. This parameter is then directly related to the platform efficiency and to its theoretical maximum ratings in terms of current. This leads to the conclusion that an objective in the design is to reduce these resistances to the lowest possible value. The faster the simulation can be executed, the more accurate are the voltage calculated and applied to the filter, and the lower can be chosen the value of the resistances and then the higher will result the efficiency and the maximum power of the platform. As a reference, on a general purpose PC of the current generation the simulation of an induction motor required an execution time around 250 μs. In certain embodiments, software revisions can significantly improve this performance.

The implementation described herein involved an industrial inverter. As already mentioned, the present invention focuses on creating a design that can be easily customized for different applications. It is important to adopt a hardware structure extremely flexible and scalable.

As described herein, real-time simulations and the control algorithms can be executed in the VTB RT environment. However, in certain embodiments, interactive software can be utilized where each change in the schematic (mostly model parameters) reflects dynamically on the real-time simulation.

The following devices are examples of what this invention can emulate, but shall not be construed to unduly limit the scope of the invention. This invention can be used to emulate devices such as elevators, escalators, fuel cells, and any other electromechanical devices.

EXAMPLES

Example 1

The interface (the three-phase filter and inverter) and control algorithm have been preliminarily tested with numerical simulations in Virtual Test Bed (VTB). In the simulation, both the frequency for the digital controller and the switching frequency for the inverter were set to 10 kHz. The gate signals for the inverter were determined with a SpaceVector-PWM technique. The filter has been designed as a Butterworth filter with a cut-off frequency of 500 Hz and resistance input of 2Ω. The resulting filter parameters are summarized in Table 1.

TABLE 1

Filter parameters.

| Parameter | Value |
| --- | --- |
| $R_A R_B$ | 2 Ω |
| $L_A L_B$ | 0.636 mH |
| $R_C$ | 0.2 Ω |
| C | 0.318 mF |

Figure 3:
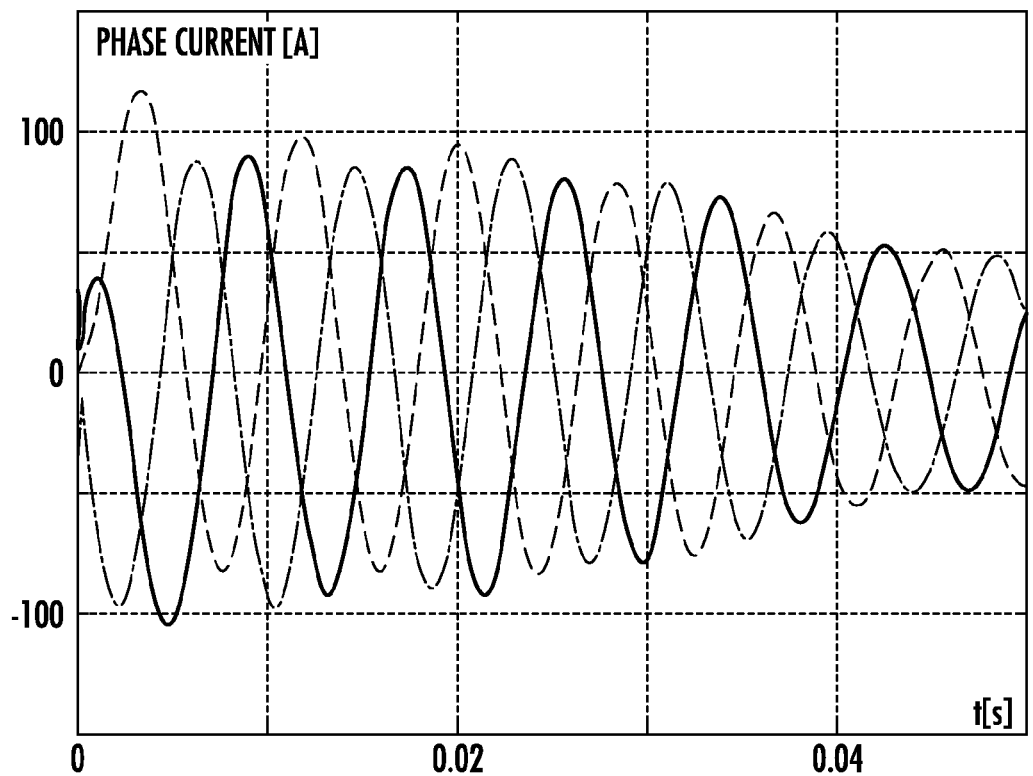
FIG. 3 illustrates (a) reference currents (continuous line) and filter currents (dotted line) and (b) zoomed view.
Figure 3:
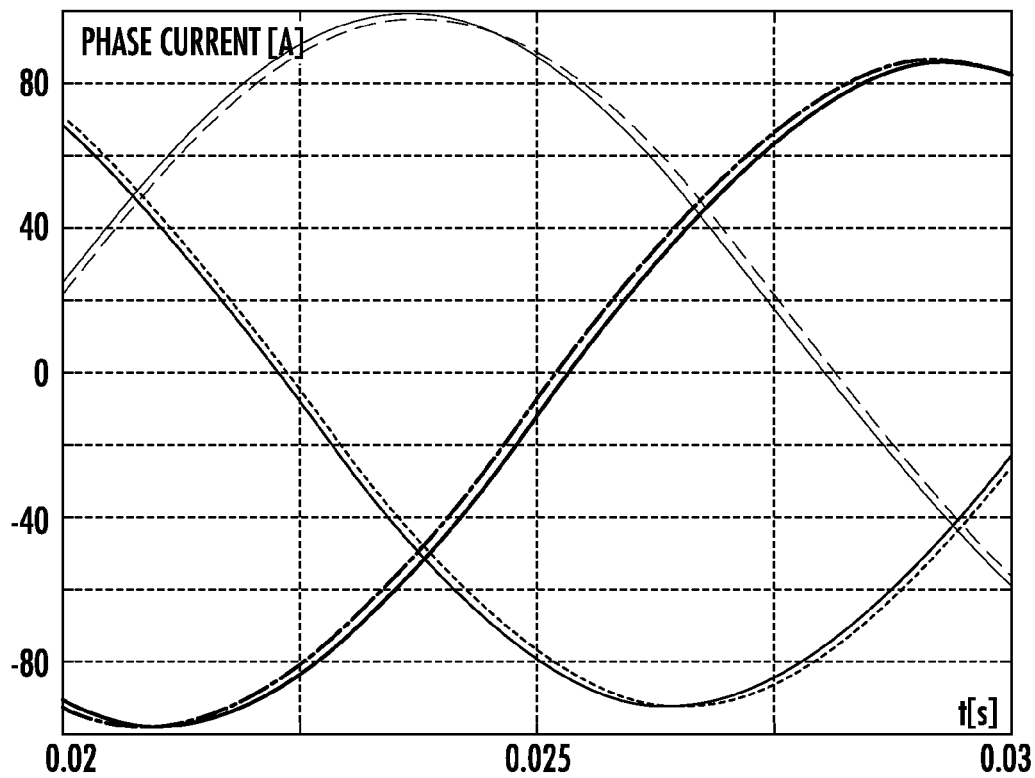
Figure 4:
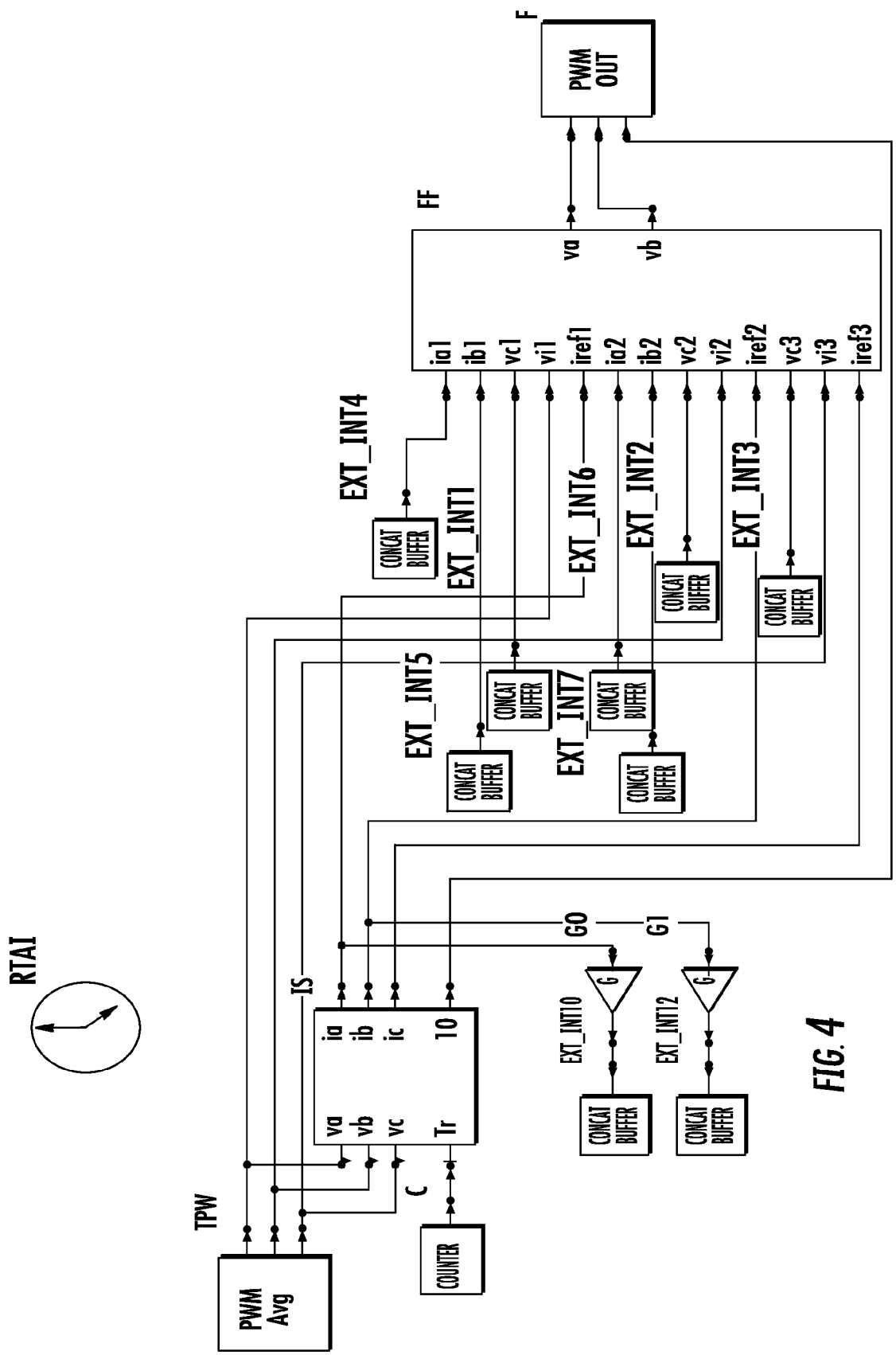
FIG. 4 illustrates a VTB-RT schematic.

In the simulation, the scheme is emulating a transient operation for an induction motor. A symmetrical three-phase system of voltages is applied to the filter. The reference currents and the currents flowing in the filter with a time interval of 0.1 s are shown in FIG. 3. The simulation results demonstrate that the currents flowing in the filter satisfactorily track their reference. In particular, the zoomed view established that the main difference between the currents and their reference is a delay whose value is comparable to the time step of the digital controller.

The implementation of the whole control platform was performed following three different steps of growing complexity:

1) Implementation of a low power single-phase test-bed
2) Implementation of a low power three-phase test-bed
3) Implementation of the full power system on hardware provided by Schindler The single-phase prototype was implemented as a proof a concept to verify the assumptions during the design phase and the real capability of the control algorithm. For the low power set-up the DC bus voltage is set at 30 V and both the inverter under test and the inverter used for the test-bed are obtained using two legs of an IRAMX16UP60A integrated power module from International Rectifier.

In the second stage the same hardware was modified to operate as a three-phase system with a DC bus voltage of 80V. For the full power system standard Schindler inverter (VF 30 model) based on Semikron MiniSKiip8 power module architecture were adopted. Both the low power and the high power setup currents and voltages were measured by using standard LEM sensors.

For the second and the third set-up the same filter was adopted with the following parameters:

TABLE 2

Filter parameters for the experimental setup

| Parameter | Value |
| --- | --- |
| $R_A R_B$ | 2.4 Ω |
| $L_A L_B$ | 1.0 mH |
| $R_C$ | 0.33 Ω |
| C | 0.340 mF |

The filter was designed keeping in mind the switching frequency of the Schindler inverter that is 8 kHz. The real-time simulation was executed on a standard DELL PC with Intel Pentium 4 with clock at 3 GHz. On the PCI bus of this PC an FPGA board XC3S1500-FG456 by Avnet was inserted. The FPGA card performed the following tasks:

1) Gate Signal Averaging of the switching signals generated by the inverter under test
2) Actuation of the Space Vector Modulation algorithms according to the voltage reference calculated by the real-time model
3) Generation of the encoder signals corresponding to the speed of the induction machine calculated by the real time simulation.

Figure 5:
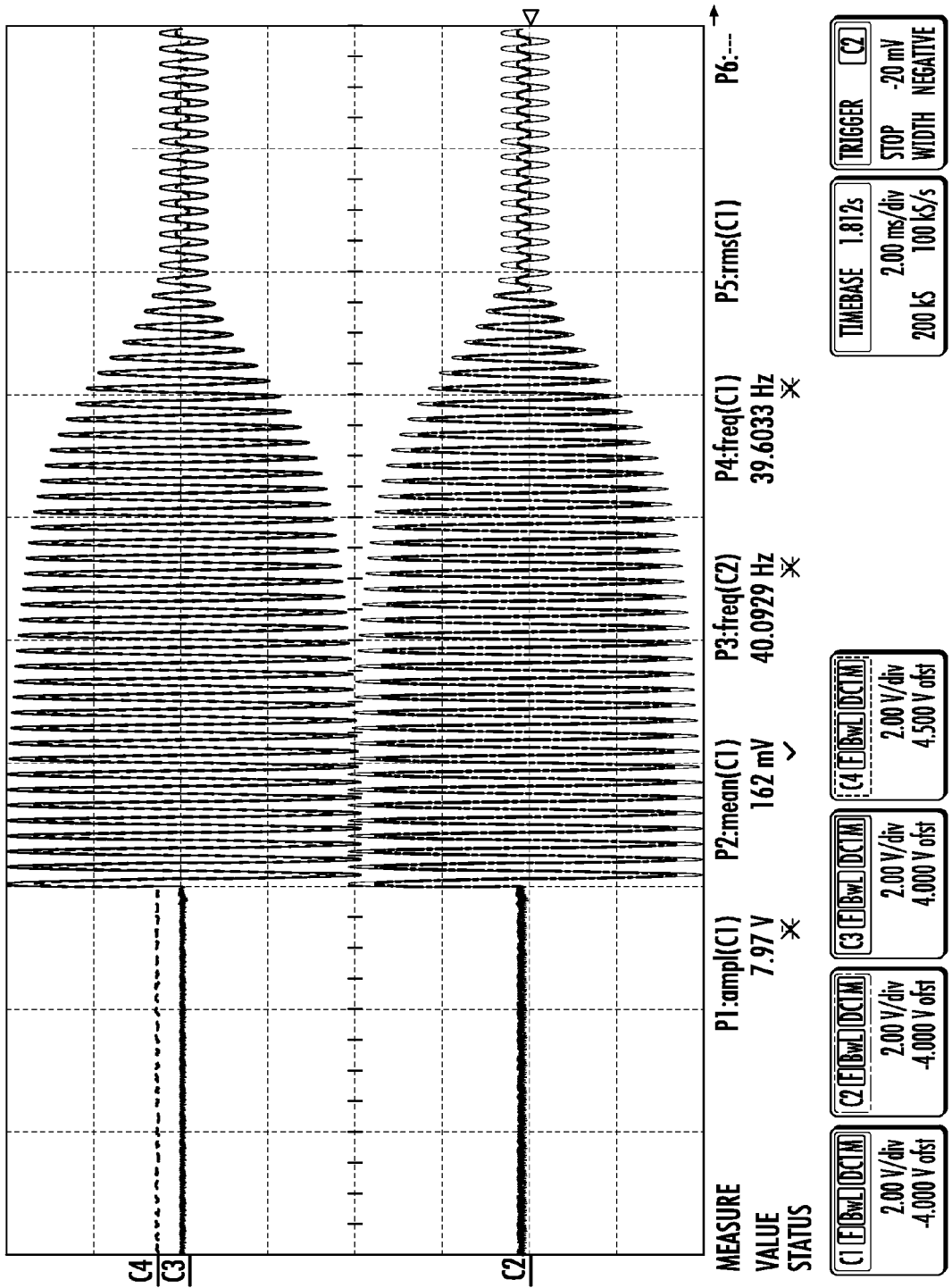
FIG. 5 illustrates the starting transient of a virtual induction machine with a step change in the output frequency reference (1.25 A/div).

The VTB-RT schematic was executed with a time-step of 500 μs. The schematic adopted for the second and third setup was reported as illustrated in FIG. 5. From the schematic, it was possible to identify the following components:

1) Input from the Analog Channels (currents and voltages in the three-phase filter). Notice that only two currents are measured while three voltage sensors are needed considering that a zero sequence of the voltage could be present in the filter
2) Input from the FPGA concerning the gate signal averaging
3) Calculation of the dynamic model of the induction machine and the mechanical system connected to it
4) PWM reference output and speed signal output to the FPGA The algorithm was calculated in the Park domain and also the reference was sent to the FPGA in the Park domain. FIG.

Figure 6:
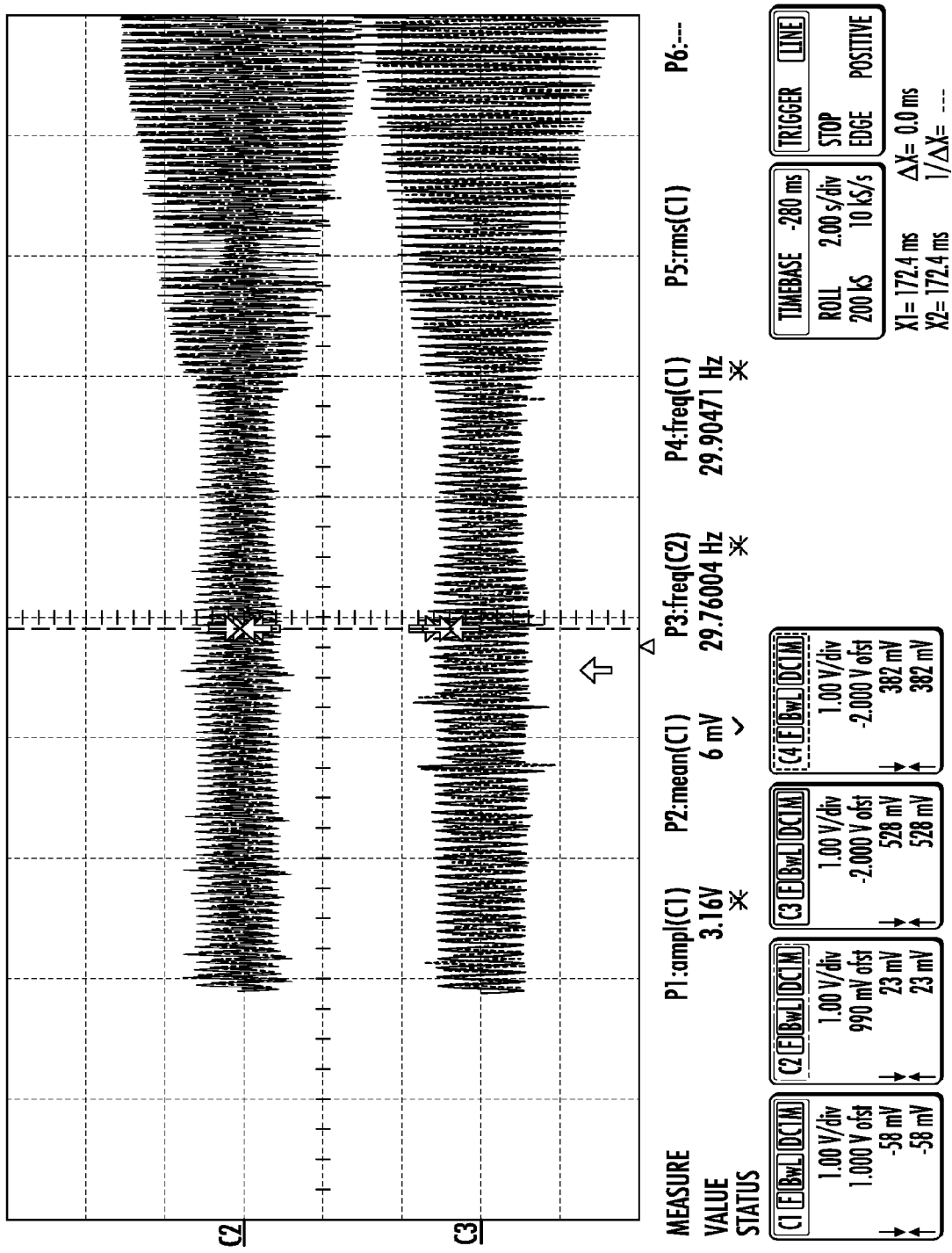
FIG. 6 illustrates the transient test for a frequency ramp in Power Hardware in the Loop experiment (1.25 A/div).

5 shows an experimental transient running with the intermediate power set-up while FIG. 6 reports a steady state operation of the full power setup.

From the results it is possible to appreciate how the algorithm is able to track the current reference with virtually no delay and an optimal waveform quality. The complete frequency range up to 60 Hz has been successfully tested.

Example 2

Many systems for HIL simulation have already been developed, such as QNX, RTOS, and Opal-RT. However, all of them are based on proprietary solutions. VTB-RT is unique among these commercial real-time systems, because it is completely implemented with public domain software and off-the-shelf hardware. From the software point of view, VTB-RT consists of three free software packages.

Linux: Linux is selected as the operating system of VTB-RT due to its low cost and flexibility. Different Linux distribution version have been successfully adopted Real-Time Application Interface (RTAI): RTAI is a kernel modification and enhancement package of Linux that permits the handling of time-critical tasks.

Comedi: Comedi is a library of open-source device drivers for many different data acquisition (DAQ) cards.

On top of the operating system component the simulation engine is given by the real-time extension of the Virtual Test Bed (VTB-RT). There are three major components in the VTB-RT real-time implementation.

Real-Time Task: RTAI preempts the standard Linux kernel and handles hardware interrupts. In VTB-RT, a real-time task is generated by RTAI to manage the 8254 chip (clock generator) to generate a real time clock which is used as the basis for defining the simulation step. This real-time task is a loadable module in Linux; it stays in the kernel-space upon being loaded.

Linux Process: An VTB-RT solver is realized by a set of standard Linux processes. In this way, it is similar to other Linux programs, such as a text editor. In each step interval, the solver takes in the system input from the analog input port of the DAQ card, solves the system state, and sends the system output through the output port. The Linux process is a user-space application program and thus has no direct communication with the real-time task.

Real-time FIFO: Since in VTB-RT the real-time clock information has to be passed to the solver, a real-time FIFO (First In First Out buffer) is applied as the "bridge" between the real-time task and the Linux process. Real-time FIFO is a uni-directional read/write buffer created by RTAI. After simulation starts, it continuously records the real-time clock generated by the real-time task. Simultaneously the Linux process polls the real-time FIFO, detects the real-time clock and performs the simulation.

In a generic PHIL experiment it is important to distinguish between I/O with a low-frequency spectral content and I/O with high-frequency content. The definition of high and low frequency is strictly related to the time step adopted for the real-time experiment. Current PC capabilities allow VTB-RT operations in the range of 100 μs or more depending on the complexity of the simulation scenario. While this time-step is fast enough to acquire analog inputs and generate analog outputs for a large set of practical situations, the same can not be said for the digital I/O.

Figure 8:
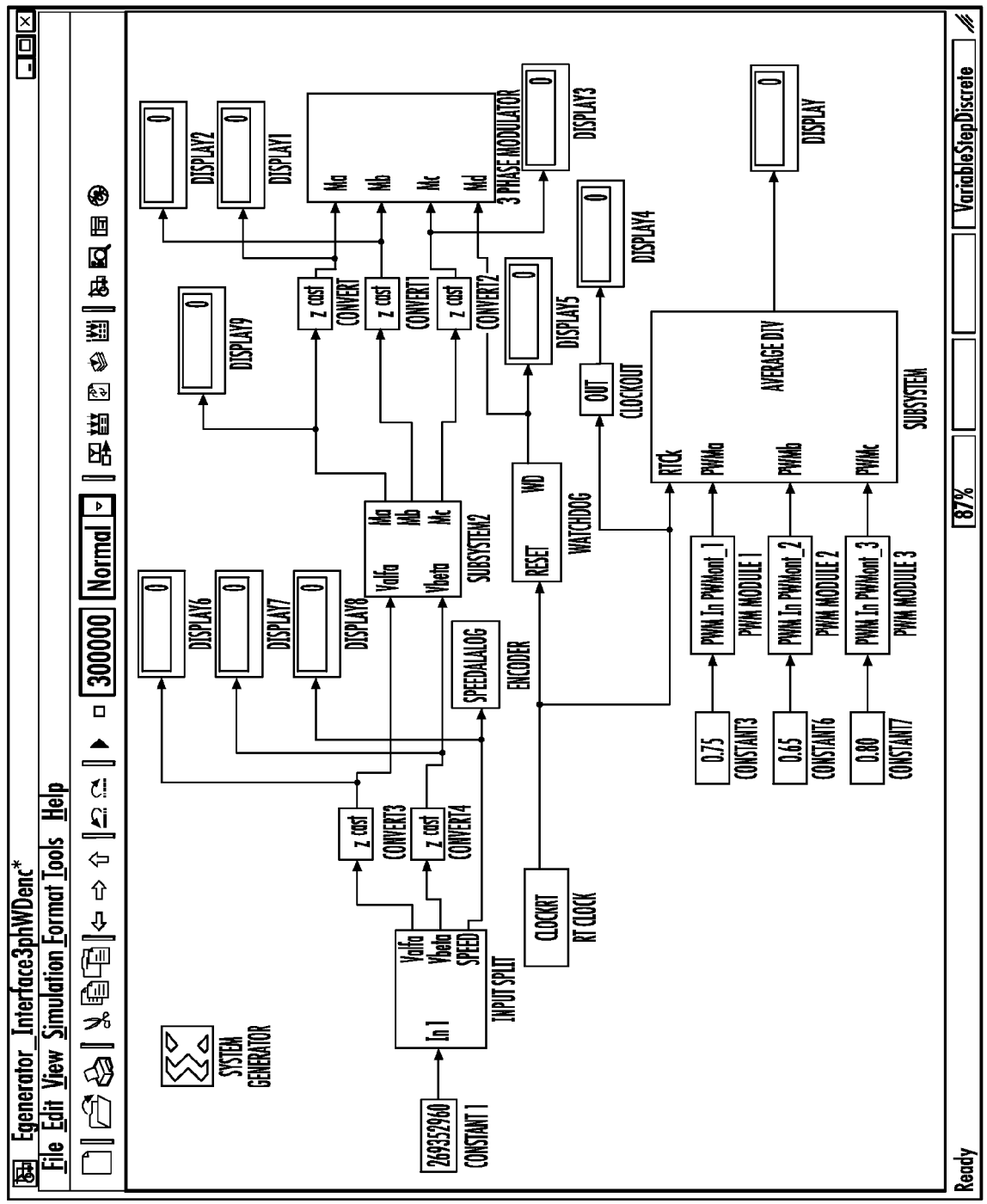
FIG. 8 illustrates the Simulink schematic of the FPGA implementation.

It is then necessary to insert a custom I/O interface to overcome the frequency bandwidth mismatch. The majority of these kind of signals are logic signals switching at high frequency (over 1 kHz). The most critical aspect is an accurate definition of the time instant for which we have a switching from one logic state to another. The exact determination of such an instant can be critical and significantly affect the quality of the overall simulation process. In power electronics and drive applications we can identify three major categories of signals:

gate signals generated by an external control system that operate as input for the RT simulation gate signals generated by the RT platform as control channels encoder signals for position and speed sensor emulation In order to have a complete and efficient real-time platform a custom FPGA-based interface has been designed and successfully implemented. This hardware extension allows the platform to interact with switching signals operating in the range of about 10 kHz. The FPGA is located on a PCI-card and can exchange data in and out with the microprocessor through the bus itself. A shared buffer of 32 bit in input and another buffer of the same size as output allow the communication between the FPGA and the main processor. The FPGA program has been implemented by using the Xilinx toolbox for Simulink. The top-level schematic of the design is reported in FIG. 8

The analysis can be split in the following sections:
PWM Output generation
Encoder output generation
Watchdog
PWM Input averaging The input is a 32 bits word that contains the following three information portions in a 10 bits format. The 32 bit word is prepared by a custom VTB model at every time step compacting the following information:

Voltage reference on the alpha axis of a fixed reference Park system

Voltage reference on the beta axis of a fixed reference Park system

Current value of the speed of the simulated electrical machine

The FPGA program splits the 32 bit word to extract the three meaningful information.

The inputs of this section are the two voltage references in the Park domain. This section of the FPGA program takes these two references, performs the inverse Park transform and then corrects the three phase references with a zero sequence component to obtain an equivalent Space Vector Modulation behavior to extend the range of values for which the PWM algorithm has a linear behavior. A calculation of the zero sequence component is performed.

Figure 9:
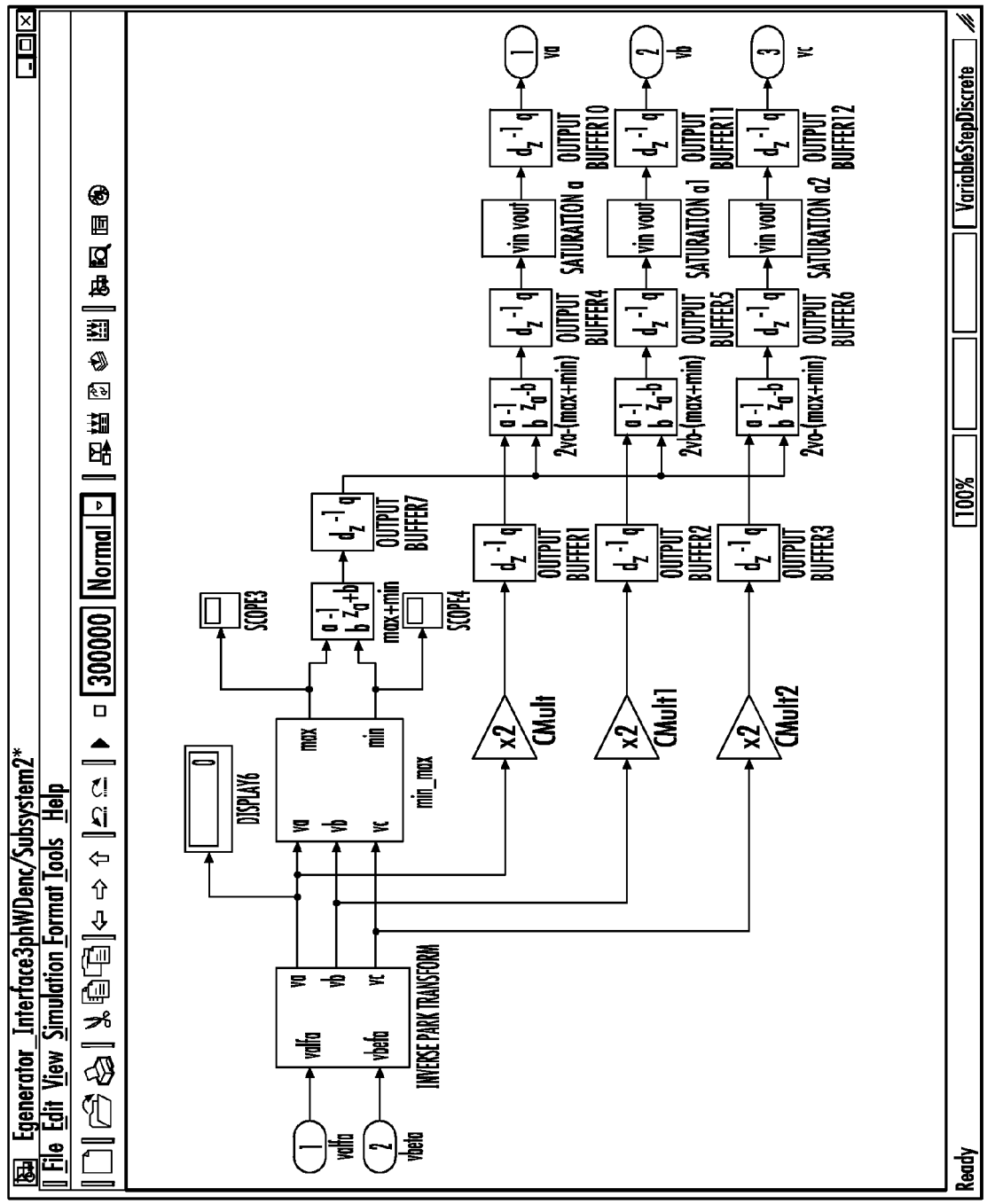
FIG. 9 illustrates space vector modulation in FPGA.

Once the three per phase references have been correctly reconstructed, three independent modulators based on the intersection between the reference voltage and a triangular modulation signal create the 6 PWM outputs. No dead-time management is performed assuming that the gate drivers will perform the correction. FIG. 9 details the implementation of the SVM in the FPGA The output signals of the PWM are also in AND condition with an enabling signal based on the watchdog circuit described in the following and an external user-input for protection management The next section of the FPGA program receives as input the 10 bits representing the speed of the machine calculated by the simulation and generates the three classical signal created by an incremental encoder:

pulse with phase 0
pulse with 90° phase displacement
index

The software can be easily customized for different number of pulses for revolution.

The watchdog is a protection device designed to disable the pulses of the PWM output channels in case the real-time simulation crushes. It is based on a free running counter and a threshold. Every time VTB-RT writes a new value on the PCI bus the watchdog is reset. If VTB-RT does not generate output for 1 ms the watchdog is triggered and the PWM disabled. This system assures that the experiment is stopped disabling any power flow in the platform as soon as the simulation is for whatever reason interrupted.

The PWM input averaging includes:
The ability to operate for a three-phase system while the previous one was designed only for a DC/DC or a single phase DC/AC converter.
The ability to compensate for any small jittering in the real-time stepping.

Figure 10:
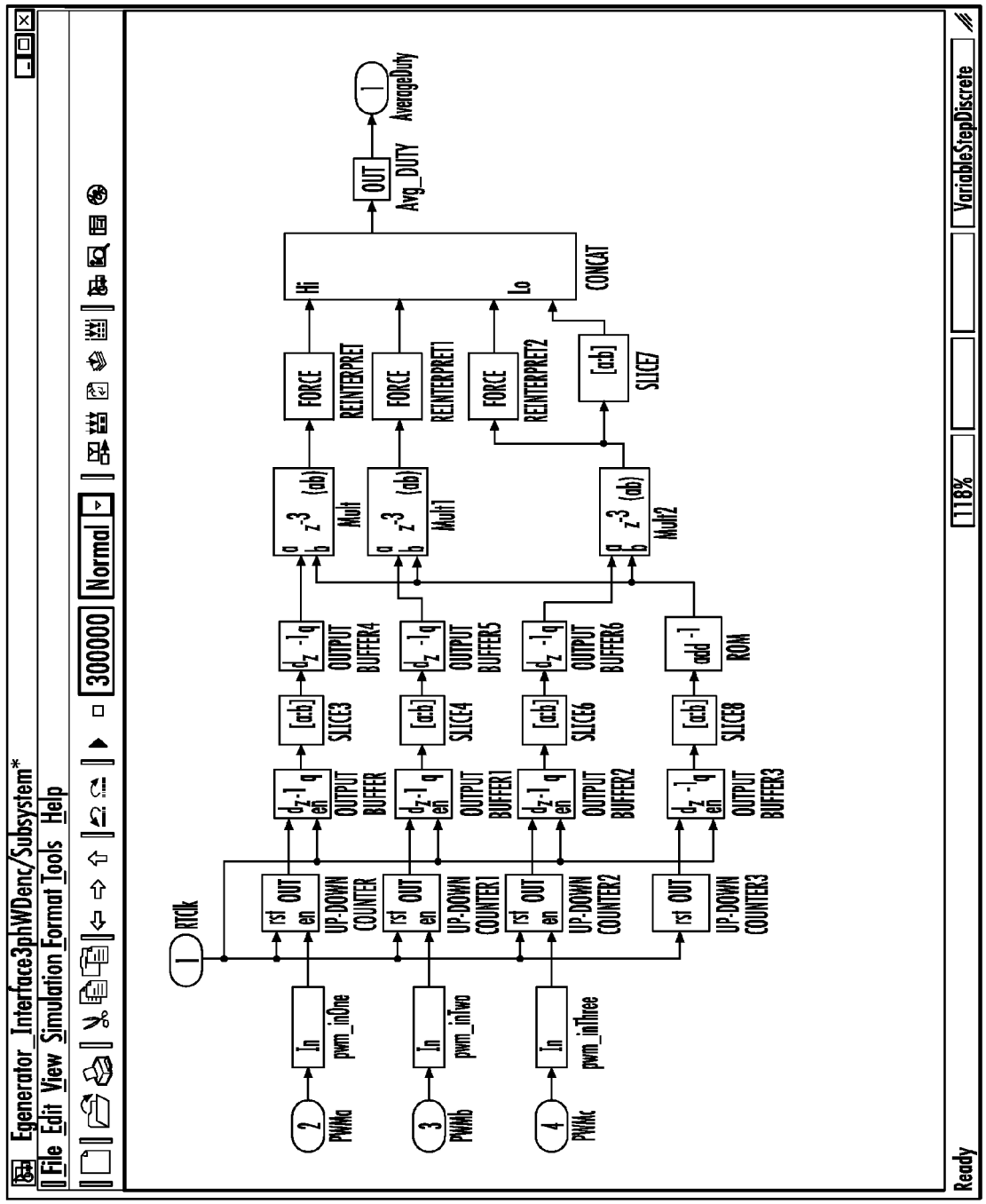
FIG. 10 illustrates PWM input averaging.

For reference, see FIG. 10. Three counters measure the time for which the PWM signals are high while a forth counter measures the time between two executions of the VTB solver (theoretically this should coincide with the time step but jittering is actually possible). The same trigger signal used for the watchdog counter is here used to measure the elapsed time. This measure of this elapsed time is then used as base to calculate the average time on. The division is performed with a look-up table that performs the inversion of the measured time The three output quantities are then combined in a 32 buffer available to VTB for reading.

The testing platform has been implemented in a configuration for testing converters in the range of 20 kW. An inverter of 18 kW manufactured by Schindler (VF30) has been adopted to control the voltage applied on the filter. An electronic interface board providing signal opto-coupling has been designed to allow the converter to be controlled by VTB-RT. The three-phase filter has been assembled with discrete components and feedback measurements are obtained from LEM transducers. During the experimental test a second Schindler inverter of the same type has been used as converter under test. Its control signals have been generated by DSpace DS1104 where a simple Volt per Hertz control has been implemented.

Figure 11:
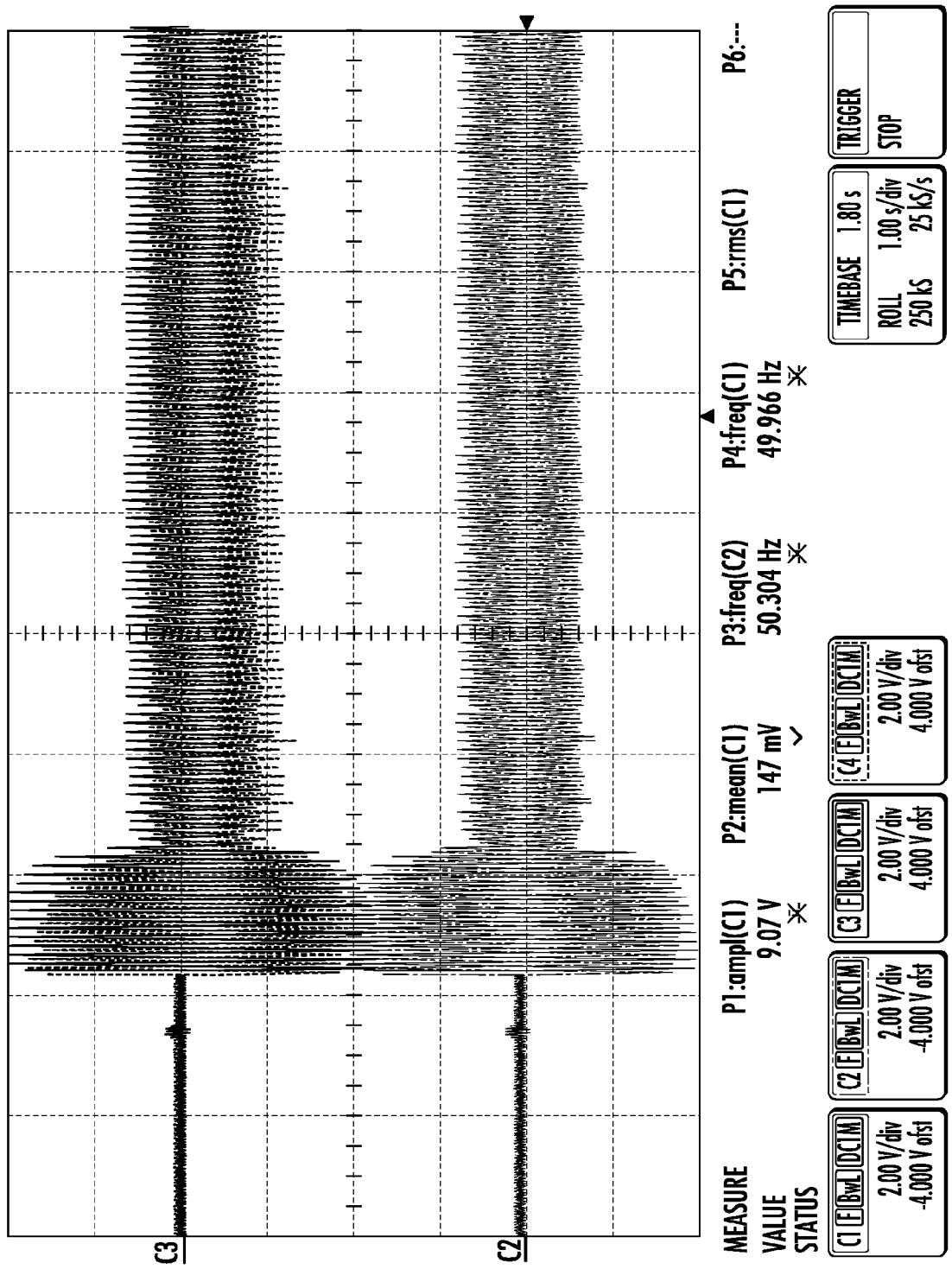
FIG. 11 illustrates the starting transient of a virtual induction machine with a step change in the output frequency reference (1.25 A/div).
Figure 12:
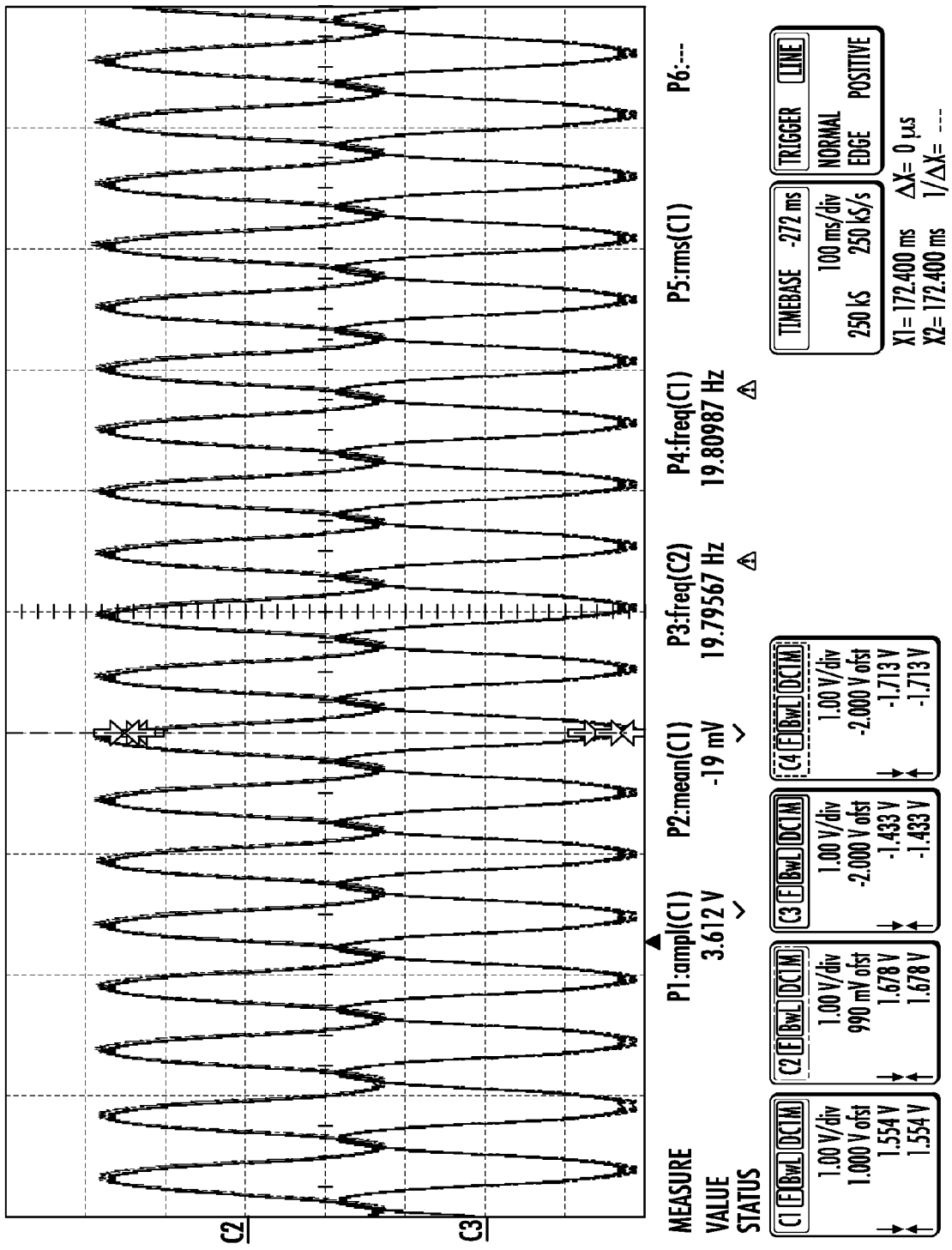
FIG. 12 illustrates the steady-state behavior of the PHIL platform (1.25 A/div).

FIG. 11 details the transient in two currents of an induction machine when the output voltage of the converter under test is changed with a step in amplitude and frequency. As expected the transient will be very similar to that one created by the insertion of an induction machine in a distribution line. The Figure reports for each of the two phases the real current together with the reference current generated by the real-time model and used by the closed control as reference. Referring again to FIG. 6, the same quantity under a different transient condition is shown. In this case the voltage frequency is not changed stepwise but following a slow ramp generated by a V/Hz control. Again the currents with references are the waveforms reported in the figure. Finally, FIG. 12 details the steady state behavior of the previous experiment where it is possible to better appreciate the optimal characteristic of tracking of the control algorithm. Details on the algorithm are described above.

Currently the platform is able to manage up to 20 kW but the systems described herein could reach about 100 kW, or greater. The system of the example performed according to the expectation operating with an output frequency up to 60 Hz. The main bottleneck to the dynamic is given by the switching frequency that is 8 kHz. This frequency is set by the specific off-the-shelf power hardware adopted for the power electronic section and it is not a limit defined by the approach itself. As result of that the decoupling filter is designed with a cutoff frequency of 500 Hz. This can be considered as a trade-off between the need of decoupling the two inverter operating at 8 kHz and the need of a bandwidth higher than the rated frequency of 60 Hz. These performances are anyhow sufficient for the testing of many important equipments as for example power converters for elevator applications. In any case, it is important to correct a frequency mismatch between some of the I/O signals and the real-time simulation step. The example described an integrated flexible solution based on a FPGA card inserted in a PCI-bus of a Linux-based PC.

In the interests of brevity and conciseness, any ranges of values set forth in this specification are to be construed as written description support for claims reciting any sub-ranges having endpoints which are whole number values within the specified range in question. By way of a hypothetical illustrative example, a disclosure in this specification of a range of 1-5 shall be considered to support claims to any of the following sub-ranges: 1-4; 1-3; 1-2; 2-5; 2-4; 2-3; 3-5; 3-4; and 4-5.

These and other modifications and variations to the present disclosure can be practiced by those of ordinary skill in the art, without departing from the spirit and scope of the present disclosure, which is more particularly set forth in the appended claims. In addition, it should be understood that aspects of the various embodiments can be interchanged both in whole or in part. Furthermore, those of ordinary skill in the art will appreciate that the foregoing description is by way of example only, and is not intended to limit the disclosure so further described in such appended claims.

What is claimed:

1. A system for power hardware in the loop testing comprising:
a power system and a control system, the power system connected to a power converter of a device under test, the control system being in communication with the power system and the power converter, the control system determining the voltage input to the power system by utilizing the voltage output of the power converter, the voltage input determination being made by a control algorithm comprising $$v_{Ok} = Sx_k + Pv_{Ik} + Qi_{Ak+1}$$

where:

$$S = \frac{1}{T}\left(CL_A \frac{\frac{T}{C} + \frac{L_B}{T} + R_B + R_C}{T + CR_C} - L_B - C\frac{L_B + R_BT}{T + CR_C}\right)$$

$$P = 1 + \frac{C}{T + CR_C}\frac{L_B + R_BT}{T}$$

$$Q = -\frac{L_A + R_AT}{T} - \frac{L_B + R_BT}{T} - \frac{C}{T + CR_C}\frac{L_A + R_AT}{T}\frac{L_B + R_BT}{T}$$

wherein symbols in the equation refer to a circuit for a decoupling filter in the control system with:
$V_i$ representing the external voltage;
$V_o$ representing the controlled voltage;
the filter inductances modeled like an inductor in series with a resistance whose values are represented by $R_A$ and $L_A$ for the inductor on the output side and $R_B$ and $L_B$ for the inductor on the controlled converter side;
the filter capacitor modeled like a capacitor in series with a resistance whose values are C and $R_C$; and
T representing the discretization time.

2. The system of claim 1, the power system comprising an RLC filter, an inverter, and a DC bus.

3. The system of claim 1, the power system comprising a three-phase RLC filter.

4. The system of claim 1, the control system comprising real-time simulation software.

5. The system of claim 4, wherein the real-time simulation software comprises VTB-RT.

6. The system of claim 1, the control system comprising a field programmable gate array, at least part of the control algorithm being executed by the field programmable gate array.

7. The system of claim 1, wherein the power converter has a power rating of from about 1 kW to about 100 kW.

8. The system of claim 1, the control system comprising a data acquisition board.

9. The system of claim 1, wherein the voltage output of the power converter is utilized to determine a reference current.

10. The system of claim 9, wherein the control algorithm determines the voltage to be applied to the filter to obtain a current that tracks the reference current.

11. A method for power hardware in the loop testing comprising:

measuring the voltage output of a power converter of a device under test;

utilizing a control system to determine the voltage input to a power system, the power system connected to the power converter, the control system being in communication with the power system and the power converter, the voltage input determination being made by a control algorithm comprising $$v_{Ok} = Sx_k + Pv_{Ik} + Qi_{Ak+1}$$

where:

$$S = \frac{1}{T}\left(CL_A \frac{\frac{T}{C} + \frac{L_B}{T} + R_B + R_C}{T + CR_C} - L_B - C\frac{L_B + R_B T}{T + CR_C}\right)$$

-continued $$P = 1 + \frac{C}{T + CR_C}\frac{L_B + R_B T}{T}$$

$$Q = -\frac{L_A + R_A T}{T} - \frac{L_B + R_B T}{T} - \frac{C}{T + CR_C}\frac{L_A + R_A T}{T}\frac{L_B + R_B T}{T}$$

wherein symbols in the equation refer to a circuit for a decoupling filter in the control system with:

$V_i$ representing the external voltages $V_o$ representing the controlled voltages;

the filter inductances modeled like an inductor in series with a resistance whose values are represented by $R_A$ and $L_A$ for the inductor on the output side and $R_B$ and $L_B$ for the inductor on the controlled converter side;

the filter capacitor modeled like a capacitor in series with a resistance whose values are C and $R_C$; and T representing the discretization time.

12. The method of claim 11, the power system comprising an RLC filter, an inverter, and a DC bus.

13. The method of claim 11, the power system comprising a three-phase RLC filter.

14. The method of claim 11, the control system comprising real-time simulation software.

15. The method of claim 14, wherein the real-time simulation software comprises VTB-RT.

16. The method of claim 11, the control system comprising a field programmable gate array, at least part of the control algorithm being executed by the field programmable gate array.

17. The method of claim 11, wherein the power converter has a power rating of from about 1 kW to about 100 kW.

18. The method of claim 11, the control system comprising a data acquisition board.

19. The method of claim 11, wherein the voltage output of the power converter is utilized to determine a reference current.

20. The method of claim 19, wherein the control algorithm determines the voltage to be applied to the filter to obtain a current that tracks the reference current.

* * * * *